(12) United States Patent
Yu et al.

(10) Patent No.: US 12,362,192 B2
(45) Date of Patent: Jul. 15, 2025

(54) METHOD FOR MANUFACTURING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventors: Yexiao Yu, Hefei (CN); Zhongming Liu, Hefei (CN); Xinman Cao, Hefei (CN); Jia Fang, Hefei (CN); Jiayun Zhang, Hefei (CN)

(73) Assignee: CHANGXI MEMORY TECHNOLOGIES, INC., Hefei (CN)

( * ) Notice: Subject to any disclaimer, the term of this patent is extended or adjusted under 35 U.S.C. 154(b) by 947 days.

(21) Appl. No.: 17/603,320

(22) PCT Filed: Jul. 20, 2021

(86) PCT No.: PCT/CN2021/107452
 § 371 (c)(1),
 (2) Date: Oct. 12, 2021

(87) PCT Pub. No.: WO2022/205687
 PCT Pub. Date: Oct. 6, 2022

(65) Prior Publication Data
 US 2023/0197461 A1   Jun. 22, 2023

(30) Foreign Application Priority Data
 Mar. 31, 2021 (CN) .......................... 202110348261.2

(51) Int. Cl.
 *H01L 21/308* (2006.01)
 *H01L 21/768* (2006.01)
 *H10B 12/00* (2023.01)

(52) U.S. Cl.
 CPC .... *H01L 21/3083* (2013.01); *H01L 21/76877* (2013.01); *H10B 12/482* (2023.02)

(58) Field of Classification Search
 CPC .......... H01L 21/3083; H01L 21/76877; H10B 12/482; H10B 12/485
 See application file for complete search history.

(56) References Cited

U.S. PATENT DOCUMENTS

| 2001/0005033 A1* | 6/2001 | Nakamura | ........... H10B 12/033 |
| | | | 257/E27.088 |
| 2005/0083750 A1* | 4/2005 | Sakagami | ............. H10B 41/30 |
| | | | 257/E27.103 |

(Continued)

FOREIGN PATENT DOCUMENTS

| CN | 101740485 A | 6/2010 |
| CN | 109390285 A | 2/2019 |

(Continued)

OTHER PUBLICATIONS

International Search Report in Application No. PCT/CN2021/107452, mailed on Dec. 30, 2021.

*Primary Examiner* — Sue A Purvis
*Assistant Examiner* — Carnell Hunter, III
(74) *Attorney, Agent, or Firm* — Syncoda LLC; Feng Ma

(57) ABSTRACT

A method for manufacturing a semiconductor structure includes: providing a substrate, a first mask and a second mask, etching the substrate by respectively using the first mask and the second mask, so as to form first grooves and second grooves on the substrate, wherein regions, in the substrate, where the first grooves and the second grooves are located form bit line grooves; and forming a conductive layer in each of the bit line grooves.

16 Claims, 15 Drawing Sheets

(56) References Cited

U.S. PATENT DOCUMENTS

| | | | | |
|---|---|---|---|---|
| 2008/0096377 A1* | 4/2008 | Kwak | ............... | H01L 21/76897 |
| | | | | 438/597 |
| 2014/0162427 A1* | 6/2014 | Gwak | .................... | H10B 61/22 |
| | | | | 438/694 |
| 2017/0005099 A1* | 1/2017 | Lee | ...................... | H10B 12/315 |
| 2020/0203348 A1* | 6/2020 | Kim | ................... | H10B 12/0335 |

FOREIGN PATENT DOCUMENTS

| CN | 208706648 U | 4/2019 |
|---|---|---|
| CN | 110943045 A | 3/2020 |
| CN | 111048467 A | 4/2020 |
| CN | 111244092 A | 6/2020 |
| CN | 113097146 A | 7/2021 |

\* cited by examiner

METHOD FOR MANUFACTURING SEMICONDUCTOR STRUCTURE, AND SEMICONDUCTOR STRUCTURE

CROSS-REFERENCE TO RELATED APPLICATIONS

This application is a national stage of International Application No. PCT/CN2021/107452 filed on Jul. 20, 2021, which claims priority of Chinese Patent Application No. 202110348261.2 filed on Mar. 31, 2021 The disclosures of these applications are hereby incorporated by reference in their entirety.

TECHNICAL FIELD

The present disclosure relates to the technical field of semiconductors, and in particular, to a method for manufacturing a semiconductor structure, and a semiconductor structure.

BACKGROUND

A dynamic random-access memory (DRAM) is a semiconductor memory which writes and reads data rapidly and randomly, and is widely applied to data storage devices or apparatuses. The dynamic random access memory consists of a plurality of duplicated storage units, each of the storage units generally includes a capacitor structure and a transistor, the transistor has a gate electrode connected to a word line, a drain electrode connected to a bit line, and a source electrode connected to the capacitor structure; and a voltage signal on the word line can control the transistor turning on or off, so as to read, by means of the bit line, data information stored in the capacitor structure, or write, by means of the bit line, data information into the capacitor structure for storage.

During preparation of the bit line, it is necessary to first define a position of a bit line groove on a substrate, then fill the bit line groove with a conductive material to form bit line contact nodes, and finally form the bit line on the bit line contact nodes, thereby achieving electrical connection between the bit line and an active region by means of the bit line contact nodes. However, when the bit line groove is formed, the shape of the bit line groove changes, which easily causes the bit line to collapse, and affects performance of a semiconductor structure.

SUMMARY

A first aspect of embodiments of the present disclosure provides a method for manufacturing a semiconductor structure, including:
- a substrate is provided, the substrate including a plurality of active regions;
- a first mask is provided, the first mask including a plurality of first mask strips extending in a first direction, and the plurality of first mask strips being parallel to one another;
- the first mask is used as a mask, to etch the substrate blocked by the first mask strips, so as to form a plurality of first grooves in the substrate;
- a second mask is provided, the second mask including a plurality of second mask strips extending in a second direction, the plurality of second mask strips being parallel to one another, and the first direction intersecting with the second direction;
- the second mask is used as a mask to etch the substrate blocked by the second mask strips, so as to form a plurality of second grooves in the substrate, wherein regions, of the substrate, where the first grooves and the second grooves are located form bit line grooves, and the bit line grooves expose a part of the active regions; and
- a conductive layer is formed in each of the bit line grooves.

A second aspect of embodiments of the present disclosure provides a semiconductor structure, the semiconductor structure being manufactured by described method, wherein the semiconductor structure includes a substrate and bit lines, wherein the substrate is internally provided with a plurality of active regions, each of the bit lines includes a conductive layer and a first dielectric layer, the conductive layer is provided in the substrate, and the first dielectric layer is located on the conductive layer.

In the method for manufacturing the semiconductor structure, and the semiconductor structure provided by the embodiments of the present disclosure, the first mask has a plurality of the first mask strips in the first direction, the second mask has a plurality of the second mask strips in the second direction, and projections, on the substrate, of the first mask strips and the second mask strips intersect; in this way, when the second mask is used as the mask to etch the substrate, even if the second mask is offset in the first direction or the second direction, patterns of the bit line grooves formed on the substrate do not change, accuracy of pattern transfer is improved, and then stability of bit line structures is further ensured.

In addition to technical problems solved by the embodiments of the present disclosure, the technical features constituting technical solutions, and beneficial effects brought about by the technical features of the technical solutions as described above, other technical problems that can be solved by the method for manufacturing the semiconductor structure and the semiconductor structure provided by the embodiments of the present disclosure, other technical features included in the technical solutions, and beneficial effects brought about by the other technical features will be further described in detail in specific embodiments.

REFERENCE SIGNS

Figure 1:
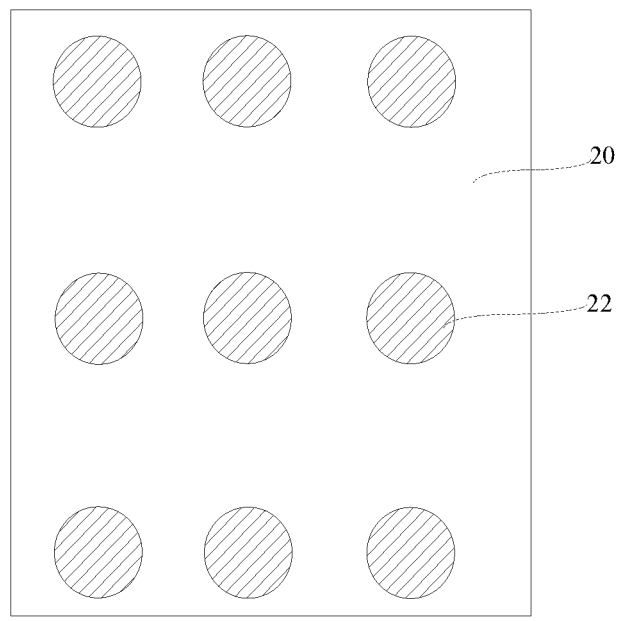
FIG. 1 is a structural schematic diagram of a first mask provided in a related art.
Figure 2:
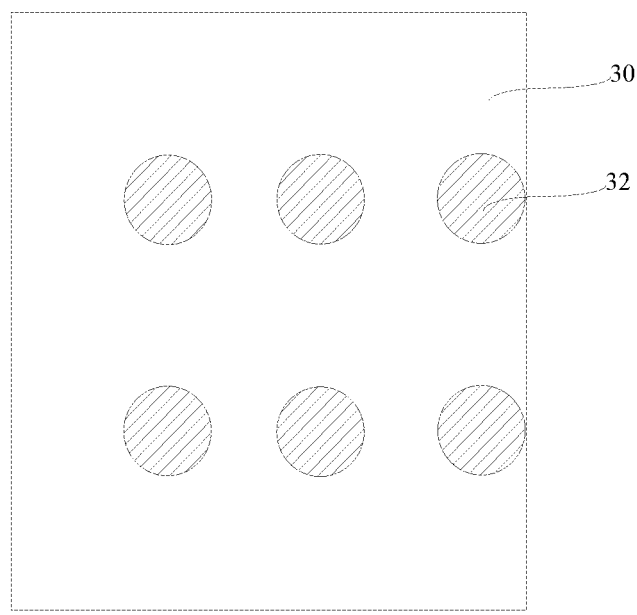
FIG. 2 is a structural schematic diagram of a second mask provided in the related art.
Figure 3:
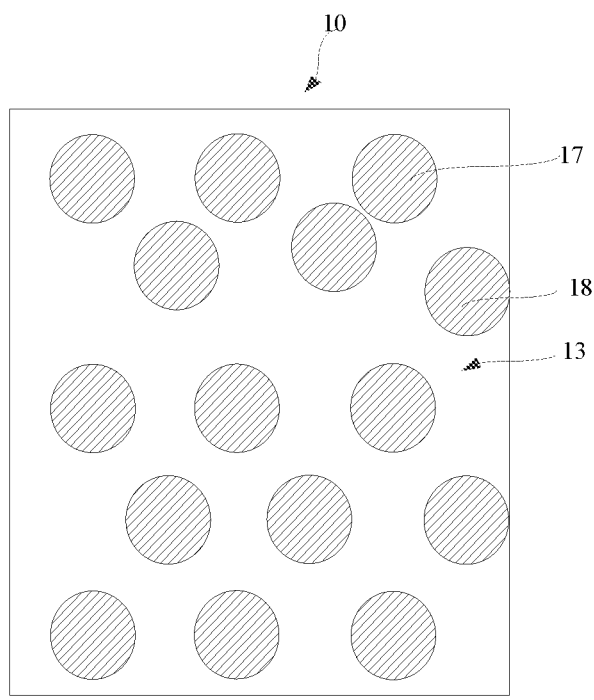
FIG. 3 is a structural schematic diagram of a substrate provided in the related art.
Figure 4:
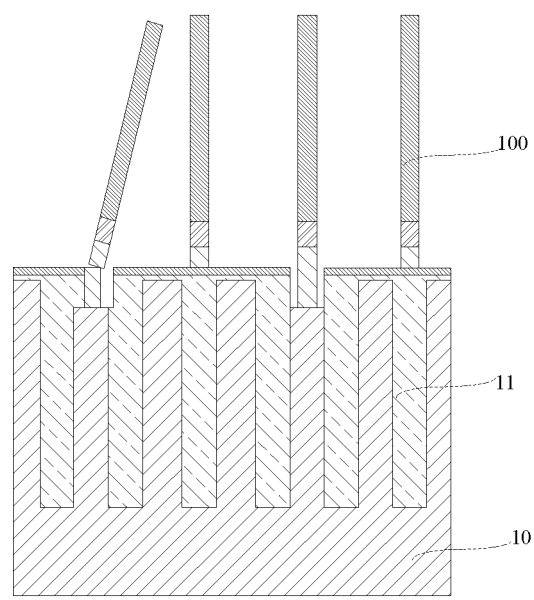
FIG. 4 is a structural schematic diagram of bit lines provided in the related art.

| | |
|---|---|
| 10: substrate; | 11: isolation layer; |
| 12: active region; | 13: bit line groove; |
| 14: isolation structure; | 15: first groove; |
| 16: second groove; | 17: first isolation layer; |
| 18: second isolation layer; | 20: first mask; |
| 21: first mask strip; | 22: first mask structure; |
| 30: second mask; | 31: second mask strip; |
| 32: second mask structure; | 40: conductive layer; |
| 41: first initial conductive layer; | 42: second initial conductive layer; |
| 43: first conductive layer; | 44: second conductive layer; |
| 45: trench; | 50: barrier layer; |
| 51: initial barrier layer; | 60: first transfer pattern layer; |
| 61: etching stop layer; | 70: first initial dielectric layer; |
| 71: first dielectric layer; | 80: second transfer pattern layer; |
| 90: third mask; | 91: third mask strip; |
| 911: first mask unit; | 912: second mask unit; |
| 913: third mask segment; | 100: bit line; |
| 101: first bit line structure; | 102: second bit line structure; |
| 110: second dielectric layer; | 120: bit line contact structure. |

DETAILED DESCRIPTION

As shown in FIGS. 1 to 4, when preparing bit lines, generally, a first mask 20 is provided first, the first mask 20 has first circular mask structures 22, and a substrate 10 is etched by using the first mask 20 as a mask, so as to form a plurality of first isolation layers 17 spaced apart on the substrate 10; then, a second mask 30 is provided, the second mask 30 also has second circular mask structures 32, and the substrate 10 is etched by using the second mask 30 as a mask, so as to form a plurality of second isolation layers 18 spaced apart on the substrate 10, and a region of the substrate 10 except the first isolation layers 17 and the second isolation layers 18 constitute bit line grooves 13.

However, in a process of etching the substrate by using the second mask as the mask, it is difficult to control positioning accuracy of the second mask, which will cause the second mask to deflect, so that positions between the first isolation layers and the second isolation layers change, and shapes of the bit line grooves change, and thus bit lines 100 collapse, thereby affecting stability of a semiconductor structure.

With regard to described technical problem, in a method for manufacturing a semiconductor structure, and a semiconductor structure provided by embodiments of the present disclosure, a first mask has a plurality of first mask strips in a first direction, a second mask has a plurality of second mask strips in a second direction, and projections, on a substrate, of the first mask strips and the second mask strips intersect; and thus, when the second mask is used as a mask to etch the substrate, even if the second mask is offset in the first direction or the second direction, patterns of bit line grooves formed on the substrate do not change, accuracy of pattern transfer is improved, and stability of the bit line structures formed on the bit line grooves is ensured, further improving performance of the semiconductor structure.

In order to make described objects, features and advantages of the embodiments of the present disclosure more apparent and understandable, technical solutions in the embodiments of the present disclosure will be clearly and completely described below with reference to accompanying drawings in the embodiments of the present disclosure. Apparently, described embodiments are merely a part rather than all of embodiments of the present disclosure. All other embodiments obtained by those of ordinary skill in the art on basis of the embodiments of the present disclosure without any inventive effort shall all fall within scope of protection of some embodiments of the present disclosure.

Figure 5:
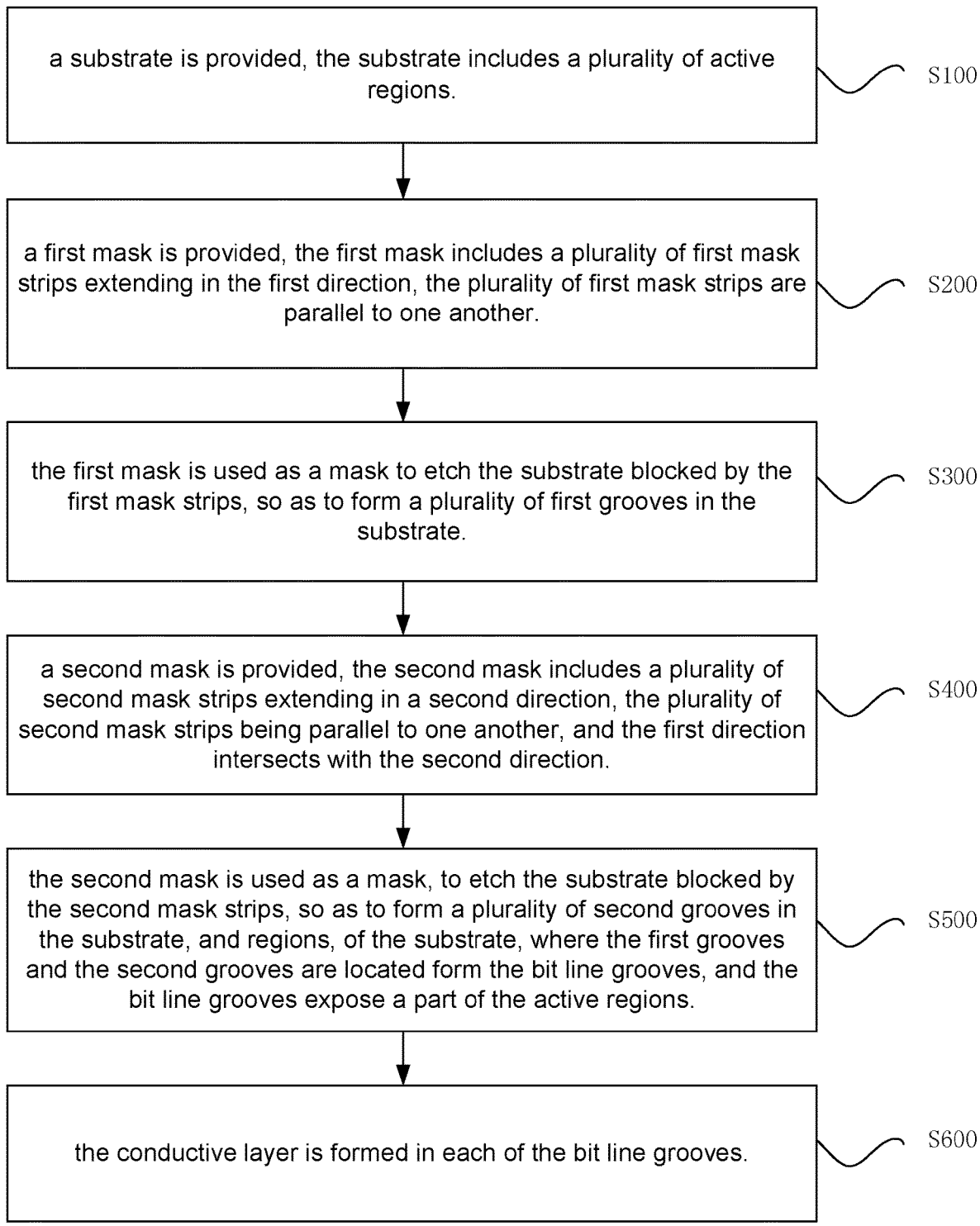
FIG. 5 is a process flowchart of a method for manufacturing a semiconductor structure provided according to embodiments of the present disclosure.

FIG. 5 is a process flowchart of the method for manufacturing the semiconductor structure provided according to embodiments of the present disclosure; and FIGS. 6-26 are schematic diagrams of various fabrication stages of the method for manufacturing the semiconductor structure. Hereinbelow, the method for manufacturing the semiconductor structure will be described in detail in conjunction with FIGS. 5-26.

In this embodiment, the semiconductor structure is not limited. Hereinafter, introduction is made by taking the semiconductor structure being a dynamic random access memory (DRAM) as an example, but this embodiment is not limited thereto, and the semiconductor structure in this embodiment may also be other structures.

As shown in FIG. 5, the method for manufacturing the semiconductor structure provided by the embodiments of the present disclosure includes the following steps:

step S100: a substrate is provided, the substrate includes a plurality of active regions.

Figure 6:
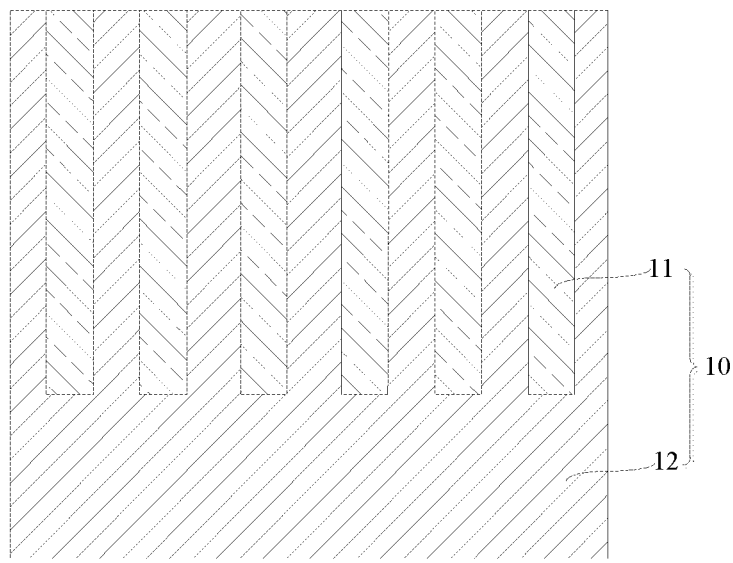
FIG. 6 is a structural schematic diagram of a substrate in the method for manufacturing the semiconductor structure provided according to embodiments of the present disclosure.

As shown in FIG. 6, the substrate 10 serves as a support component for the semiconductor structure and is configured to support other components provided thereon, and the substrate 10 is made of semiconductor materials, and the semiconductor materials are one or more of silicon, germanium, silicon-germanium compound and silicon-carbide compound.

In order to achieve insulation arrangement of the active regions, a plurality of isolation layers 11 are further provided in the substrate 10, and the isolation layers 11 are configured to isolate the active regions, and the isolation layers 11 are trench isolation layers, that is, isolation trenches are formed in the substrate 10, and isolation materials are deposited into the isolation trenches so as to form the isolation layers 11, for example, silicon dioxide is deposited into the isolation trenches.

Regions in the substrate 10 except the isolation layers 11 are active regions 12, the active regions 12 are used for arranging transistors or other conductive components, the active regions 12 are arranged in a matrix, each of the active regions 12 is strip-shaped, and length directions of the active regions 12 extend in a first direction.

Step S200: a first mask is provided, the first mask includes a plurality of first mask strips extending in the first direction, the plurality of first mask strips are parallel to one another.

Figure 7:
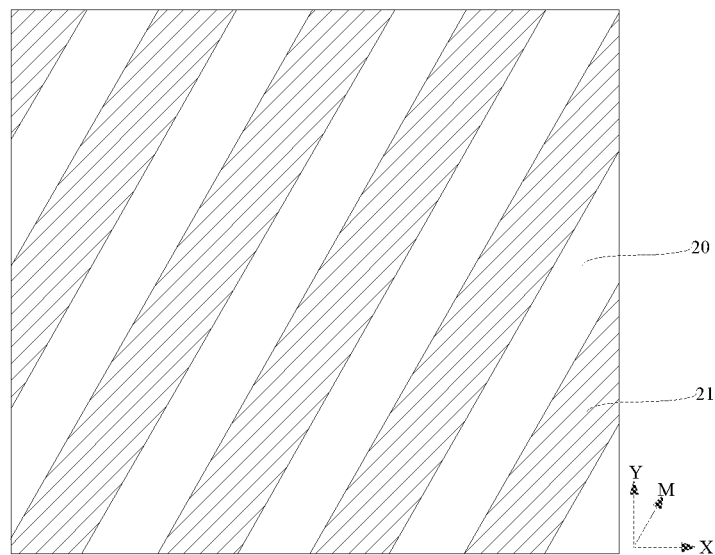
FIG. 7 is a structural schematic diagram of a first mask in the method for manufacturing the semiconductor structure provided according to embodiments of the present disclosure.

Taking orientation shown in FIG. 7 as an example, the plurality of first mask strips 21 can extend in an M direction, there is a certain angle between the M direction and an X direction, and the plurality of first mask strips are arranged at intervals in the X direction, so that a plurality of strip-shaped isolation structures are formed on the first mask 20.

Step S300: the first mask is used as a mask to etch the substrate blocked by the first mask strips, so as to form a plurality of first grooves in the substrate.

Figure 8:
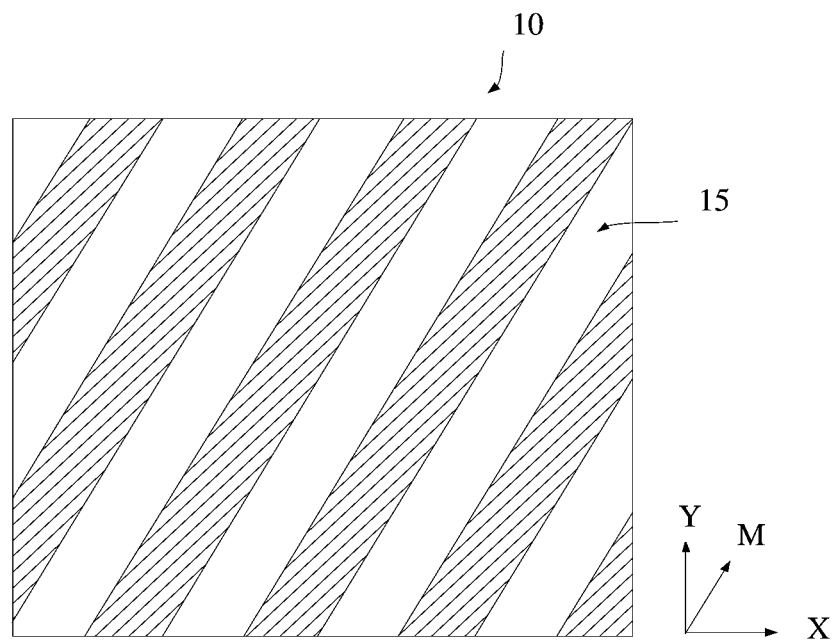
FIG. 8 is a structural schematic diagram of first grooves in the method for manufacturing the semiconductor structure provided according to embodiments of the present disclosure.

In present embodiment, the plurality of first mask strips 21 are a negative photoresist, and when the plurality of first mask strips 21 are exposed or developed, the plurality of first mask strips 21 and the substrate 10 located below the plurality of first mask strips 21 will be etched, so as to form the plurality of first grooves 15 in the substrate 10, and a shape of each of the plurality of first grooves 15 is consistent with a shape of each of the plurality of first mask strips 21, and structures thereof are as shown in FIG. 8.

Step S400: a second mask is provided, the second mask includes a plurality of second mask strips extending in a second direction, the plurality of second mask strips being parallel to one another, and the first direction intersects with the second direction.

Figure 9:
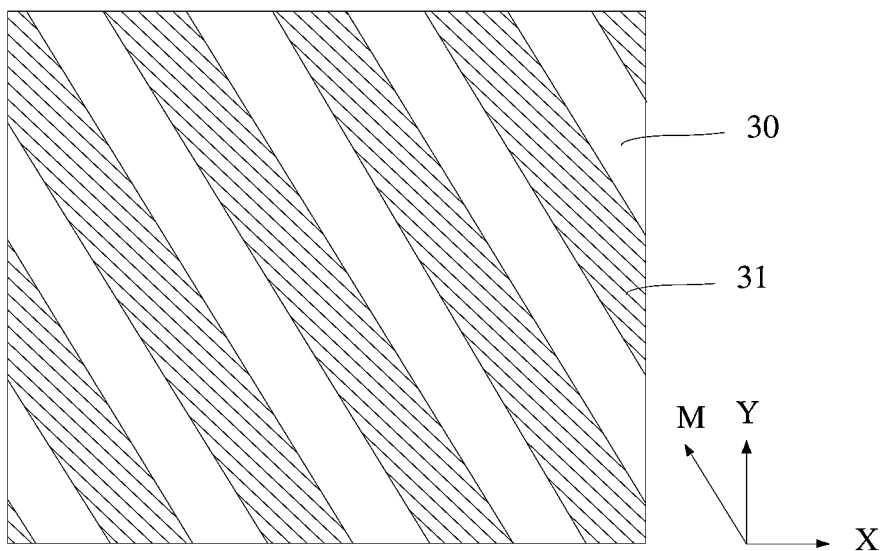
FIG. 9 is a structural schematic diagram of a second mask in the method for manufacturing the semiconductor structure provided according to embodiments of the present disclosure.

Taking the orientation shown in FIG. 9 as an example, the second mask strips 31 can extend in an N direction, there is a certain angle between the N direction and the X direction, and the plurality of second mask strips 31 are arranged at intervals in the X direction, so that a plurality of strip-shaped isolation structures are formed on the second mask 30.

Figure 10:
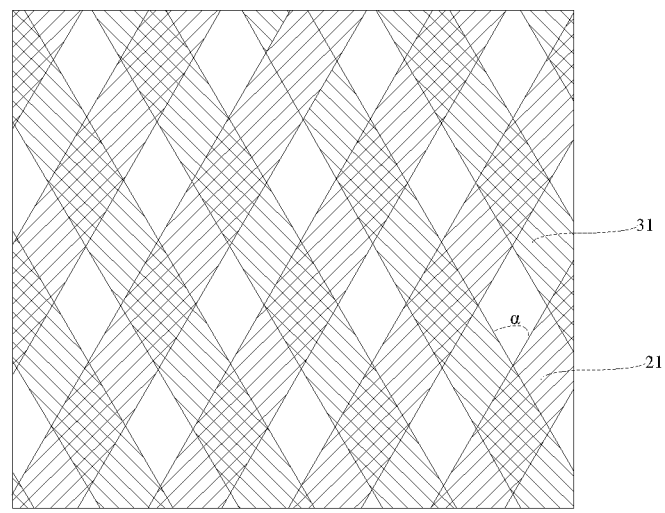
FIG. 10 is a composite diagram of the first mask and the second mask in the method for manufacturing the semiconductor structure provided by embodiments of the present disclosure.

For example, as shown in FIG. 10, an angle between the first direction and the second direction is 10° to 60°, that is to say, an angle α between the first mask strips 21 and the second mask strips 31 is 10° to 60°, so that a mask surrounded by the first mask 20 and the second mask 30 has open regions of a diamond shape, and thus shapes of bit line grooves subsequently formed do not change, and accuracy of the bit line grooves is ensured.

Step S500: the second mask is used as a mask, to etch the substrate blocked by the second mask strips, so as to form a plurality of second grooves in the substrate, and regions, of the substrate, where the first grooves and the second grooves are located form the bit line grooves, and one of the bit line grooves exposes a part of one of the active regions.

Figure 11:
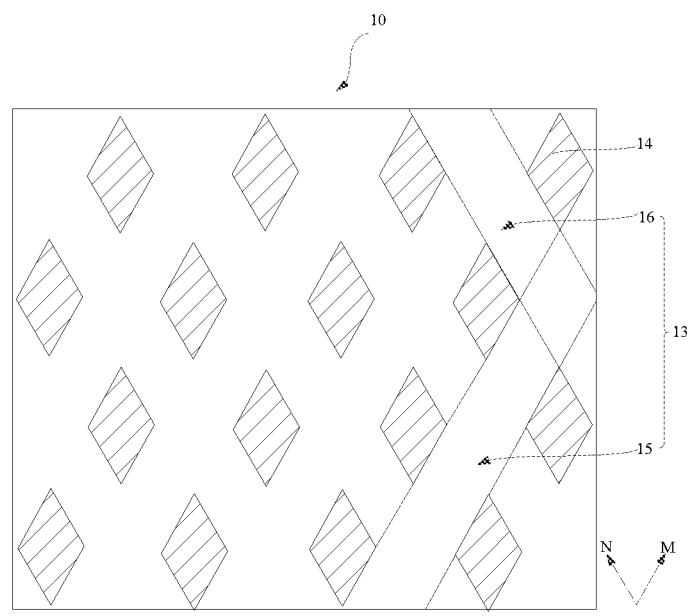
FIG. 11 is a structural schematic diagram of forming line contact regions in the method for manufacturing the semiconductor structure provided by embodiments of the present disclosure.

In this embodiment, each of the second mask strips 31 is a negative photoresist, and when the second mask strips 31 are exposed or developed, the second mask strips 31 and the substrate 10 located below the second mask strips 31 are etched, so as to form the plurality of second grooves 16 in the substrate 10, and a shape of each of the plurality of second grooves 16 is consistent a shape of each of the plurality of second mask strips 31, and the structures thereof are as shown in FIG. 11.

Continuing to refer to FIG. 11, the regions, of the substrate 10, where the first grooves 15 and the second grooves 16 are located form the bit line grooves 13, and one of the bit line grooves 13 exposes a part of one of the active regions; and regions of the substrate 10 except the first grooves 15 and the second grooves 16 constitute a plurality of isolation structures 14, the second groove 16 is located between two adjacent isolation structures 14 in the first direction, and the first groove 15 is located between two adjacent isolation structures 14 in the second direction.

The present embodiment improves patterns of the first mask and the second mask, such that the first mask has the plurality of first mask strips in the first direction, the second mask has the plurality of second mask strips in the second direction, and projections, on the substrate, of the first mask strips and the second mask strips intersect with one another; in this way, when the second mask is used as the mask to etch the substrate, even if the second mask is offset in the first direction or the second direction, patterns of the bit line grooves formed on the substrate do not change, accuracy of the patterns of the bit line grooves is improved, and stability of bit lines formed on the bit line grooves is further ensured, and performance of the semiconductor structure is improved.

Further, a plane parallel to the substrate 10 is a cross section, a cross section of each of the isolation structures 14 is diamond-shaped, which facilitates the manufacturing of the first mask and the second mask, and simplifies the manufacturing process.

Figure 12:
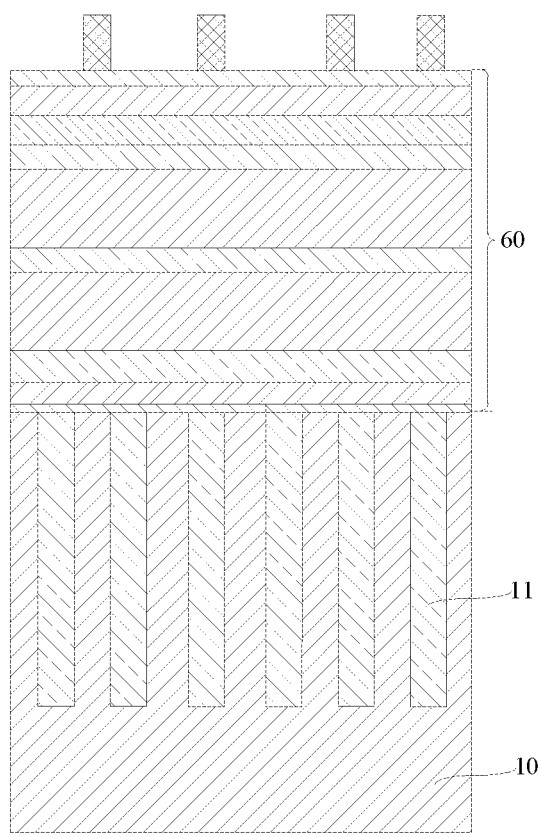
FIG. 12 is a structural schematic diagram of forming a first transfer pattern layer in the method for manufacturing the semiconductor structure provided by embodiments of the present disclosure.

It should be noted that when forming the bit line grooves, the first mask and the second mask can be used to directly etch the substrate; and a first transfer pattern layer can also be formed on the substrate, the patterns of the first mask and the second mask are transferred to the first transfer pattern layer first, and then pattern on the first transfer pattern layer is transferred to the substrate, and the specific process is as follows:

As shown in FIG. 12, the first transfer pattern layer 60 is formed on the substrate 10, and for example, the first transfer pattern layer 60 is formed on the substrate 10 by means of an atomic layer deposition process, a physical vapor deposition process or a chemical vapor deposition process.

After the first transfer pattern layer 60 is formed, first by using the first mask as the mask, the first transfer pattern layer 60 blocked by the first mask strips is etched, so as to form a plurality of first intermediate grooves (not shown in the figures) in the first transfer pattern layer 60, and a projection of each of the plurality of first intermediate grooves on the substrate 10 overlaps with each of the first grooves.

Then, the second mask is used as the mask, the first transfer pattern layer 60 blocked by the second mask strips is etched, so as to form a plurality of second intermediate grooves (not shown in the figure) in the first transfer pattern layer 60, and a projection of each of the plurality of second intermediate grooves on the substrate 10 overlaps with each of the second grooves.

Figure 13:
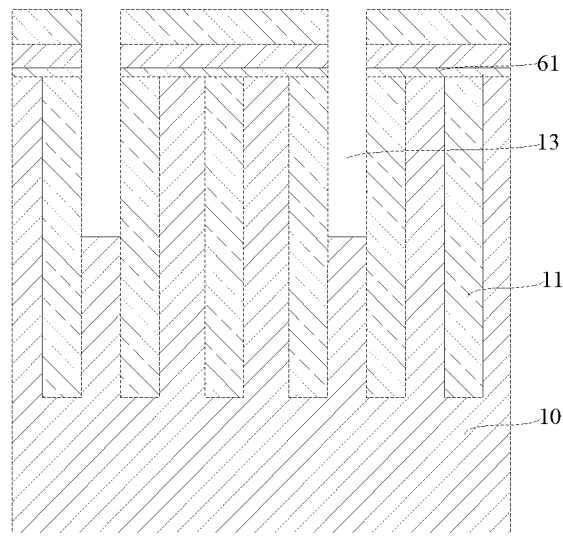
FIG. 13 is a structural schematic diagram in which a part of the first transfer pattern layer and a part of the substrate are etched in the method for manufacturing the semiconductor structure provided by embodiments of the present disclosure.
Figure 14:
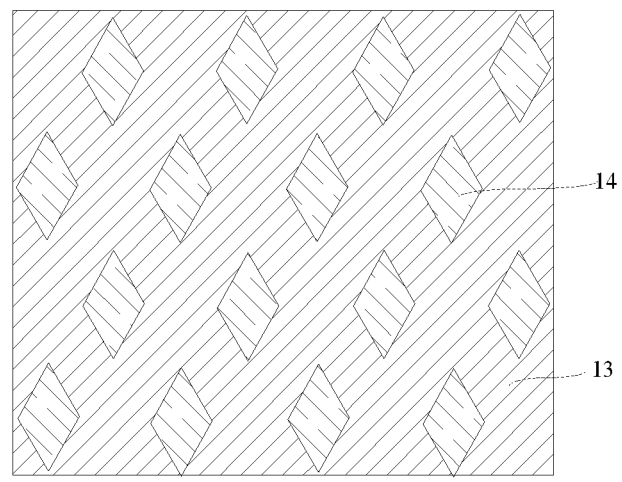
FIG. 14 is a top view of FIG. 13.

Then, the substrate 10 exposed in the first intermediate grooves and the second intermediate grooves is removed by using an etching liquid or an etching gas, so as to form the bit line grooves 13 and the isolation structures 14 on the substrate 10, and the structures thereof are as shown in FIGS. 13 and 14.

It should be noted that the first intermediate grooves and the second intermediate grooves are grooves formed on the first transfer pattern layer 60, and the first intermediate grooves and the second intermediate grooves are configured to transfer patterns on the first mask and the second mask to the first transfer pattern layer.

In this embodiment, the patterns on the first mask and the second mask are first transferred to the first transfer pattern layer, and then the pattern on the first transfer pattern layer is transferred to the substrate; in this way, accuracy of the pattern is ensured, the stability of bit lines subsequently formed in the bit line grooves is ensured, and the performance of the semiconductor structure is improved.

In this embodiment, the first transfer pattern layer 60 is a single-layer structure or a laminated structure, that is, the first transfer pattern layer 60 includes a plurality of sub-mask layers provided in stacked manner, and adjacent sub-mask layers have different materials. For example, the first transfer pattern layer 60 includes an etching stop layer 61, a first silicon oxide layer, a first hard mask layer, a first silicon oxynitride layer, a second hard mask layer, a second silicon oxynitride layer, a second silicon oxide layer, a third hard mask layer and a third silicon oxynitride layer which are stacked in sequence, and the etching stop layer 61 is provided on the substrate, and the etching stop layer 61 includes insulating material such as silicon nitride.

In some embodiments, after using the second mask as the mask, etching the substrate blocked by the second mask strips, and before forming a conductive layer in each of the bit line grooves, the method for manufacturing the semiconductor structure further includes:

Barrier layers 50 are formed on sidewalls of each of the bit line grooves 13, the barrier layers 50 are configured to prevent conductive material in the conductive layer from diffusing into the substrate 10.

Figure 15:
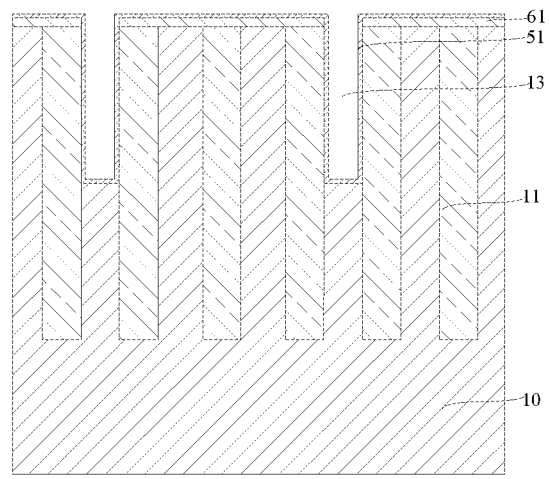
FIG. 15 is a structural schematic diagram of forming an initial barrier layer in the method for manufacturing the semiconductor structure provided by embodiments of the present disclosure.

For example, as shown in FIG. 15, first, an atomic layer deposition process is used to form a initial barrier layer 51 on the sidewalls and bottom walls of each of the bit line grooves 13, and the initial barrier layer 51 extends to the outside of each of the bit line grooves 13 and covers on top surface of the etching stop layer 61.

Figure 16:
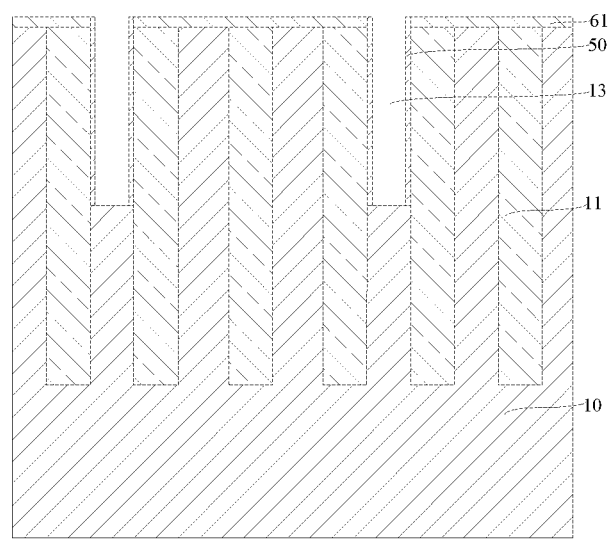
FIG. 16 is a structural schematic diagram of forming barrier layers in the method for manufacturing the semiconductor structure provided by embodiments of the present disclosure.

As shown in FIG. 16, then, the initial barrier layer 51 located on the top surface of the etching stop layer 61 and the initial barrier layer 51 located on the bottom walls of each of the bit line grooves 13 are removed by using an etching gas or an etching liquid, the initial barrier layers 51 located on the sidewalls of each of the bit line grooves 13 are reserved, and reserved initial barrier layers 51 form the barrier layers 50.

In this embodiment, the barrier layers 50 include conductive material such as titanium nitride, and the titanium nitride has conductivity while preventing permeation between conductive material in the conductive layer and the substrate, thereby ensuring the performance of the semiconductor structure.

Step S600: the conductive layer is formed in each of the bit line grooves.

Figure 17:
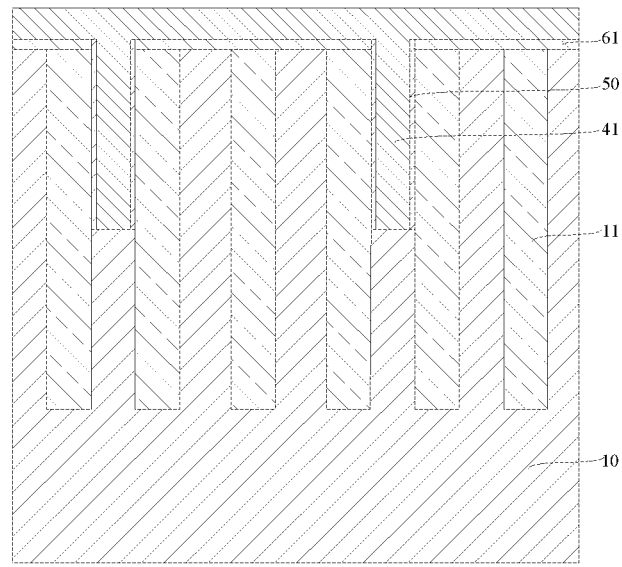
FIG. 17 is a structural schematic diagram of forming a first initial conductive layer in the method for manufacturing the semiconductor structure provided by embodiments of the present disclosure.

For example, first, as shown in FIG. 17, a first initial conductive layer 41 is formed in each of the bit line grooves 13, and the first initial conductive layer 41 extends to the outside of each of the bit line grooves 13 and is formed above the substrate 10.

Figure 18:
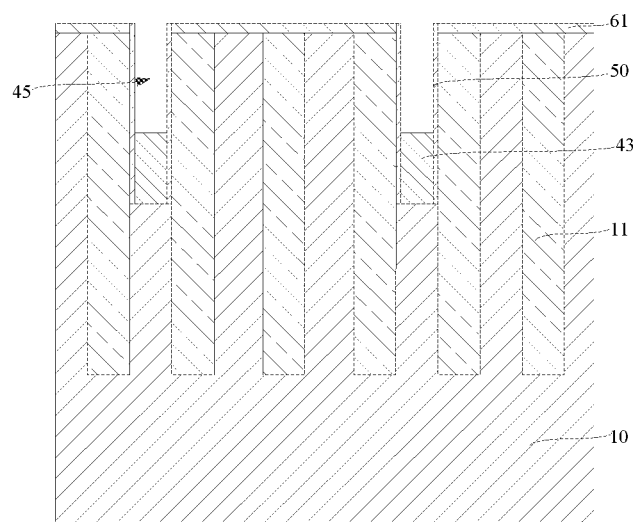
FIG. 18 is a structural schematic diagram of forming first conductive layers in the method for manufacturing the semiconductor structure provided by embodiments of the present disclosure.

Second, as shown in FIG. 18, the first initial conductive layer 41 on the substrate 10 and a part of the first initial conductive layer 41 in each of the bit line grooves 13 are removed by using an etching gas or an etching liquid, the first initial conductive layer 41 in each of the bit line grooves 13 is reserved, reserved first initial conductive layer 41 form first conductive layers 43, and a trench 45 is enclosed between each of the first conductive layers 43 and two adjacent barrier layers 50.

Figure 19:
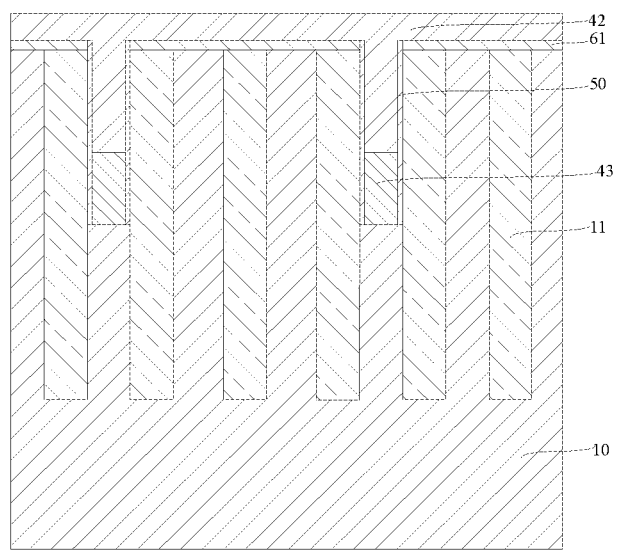
FIG. 19 is a structural schematic diagram of forming a second initial conductive layer in the method for manufacturing the semiconductor structure provided by embodiments of the present disclosure.

Then, as shown in FIG. 19, a second initial conductive layer 42 is formed in the trench 45 by a physical vapor deposition process or a chemical vapor deposition process, and the second initial conductive layer 42 extends to the outside of the trench 45. The second initial conductive layer 42 is located on the first conductive layers 43 and the substrate 10, and covers the etching stop layer 61.

Figure 20:
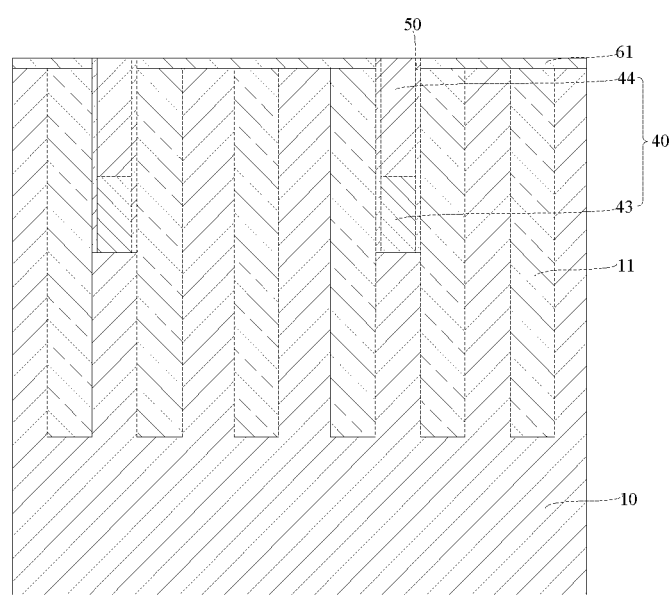
FIG. 20 is a structural schematic diagram of forming second conductive layers in the method for manufacturing the semiconductor structure provided by embodiments of the present disclosure.
Figure 21:
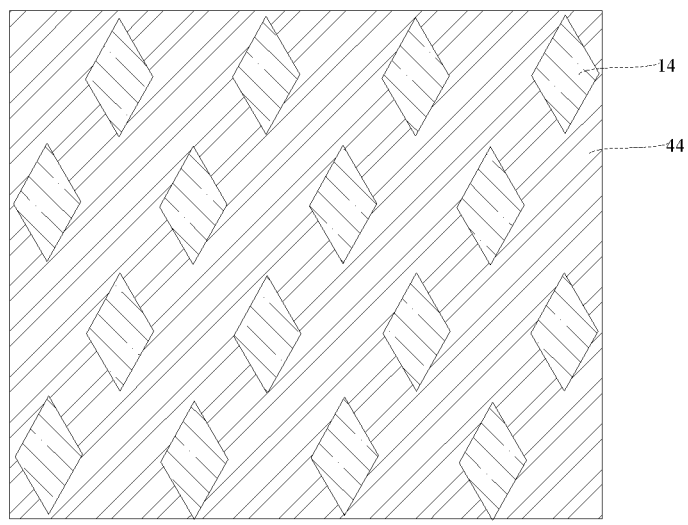
FIG. 21 is a top view of FIG. 20.

Finally, as shown in FIGS. 20 and 21, the second initial conductive layer 42 on the etching stop layer 61 is removed by using an etching gas or an etching liquid, the second initial conductive layer 42 in each of the bit line grooves 13 is reserved, and reserved second initial conductive layer 42 constitute second conductive layers 44; the upper surfaces of the second conductive layers 44 are flush with the upper surface of the etching stop layer 61, each of the first conductive layers 43 and each of the second conductive layers 44 constitute the conductive layer 40, and the first conductive layers 43 are provided below the second conductive layers 44.

In this embodiment, the material of the first conductive layers 43 and the second conductive layers 44 can be different. For example, each of the first conductive layers 43 includes conductive material such as polysilicon, and each of the second conductive layers 44 includes conductive material such as tungsten.

Figure 22:
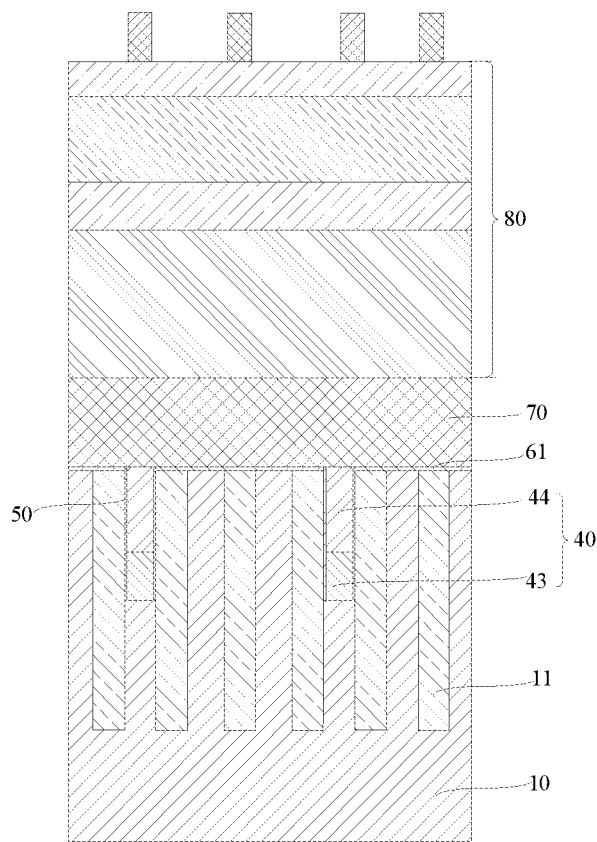
FIG. 22 is a structural schematic diagram of forming an initial dielectric layer and a second transfer pattern layer in the method for manufacturing the semiconductor structure provided by embodiments of the present disclosure.

In some embodiments, after forming the conductive layer in each of the bit line grooves, the method for manufacturing the semiconductor structure further includes:

as shown in FIG. 22, forming a first initial dielectric layer 70 on the substrate 10, that is, silicon nitride of a certain thickness can be deposited on the substrate by using an atomic layer deposition process, a physical vapor deposition process or a chemical vapor deposition process, the silicon nitride constitutes the first initial dielectric layer 70, and the first initial dielectric layer 70 covers the etching stop layer 61 and the conductive layer 40.

Figure 23:
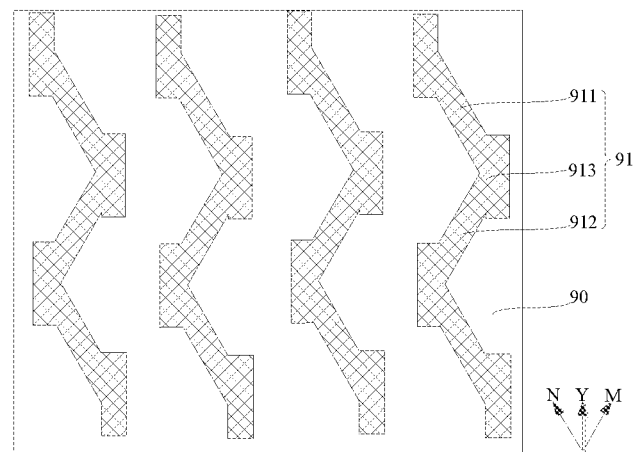
FIG. 23 is a structural schematic diagram of a third mask in the method for manufacturing the semiconductor structure according to embodiments of the present disclosure.

A second transfer pattern layer 80 having a pattern is formed on the first initial dielectric layer 70. In this step, a photoresist layer is directly formed on the second transfer pattern layer 80, and the photoresist layer is patterned by means of exposure, development or etching, and then a pattern of the photoresist layer is transferred to the second transfer pattern layer 80, and this step is also performed by the following method:

as shown in FIG. 23, first, a third mask 90 is provided, and the third mask 90 includes a plurality of third mask strips 91 arranged at intervals; and each of the third mask strips 91 includes a plurality of first mask units 911 extending in the second direction and a plurality of second mask units 912 extending in the first direction, the first mask units 911 and the second mask units 912 are provided alternately to form fold line structures. That is, two ends of each of the first mask units 911 are respectively connected to one end of each of two second mask units 912 adjacent to this first mask unit 911, a third mask segment 913 is provided at a connection position of each of the first mask unit 911 and each of the second mask unit 912, and extension direction of the third mask segments 913 is in a vertical direction Y, and the vertical direction Y is a median line direction of the first direction M and the second direction N.

An isolation structure 14 is provided in a region surrounded by projections of adjacent the first mask unit 911 and the second mask unit 912 on the substrate 10, and the isolation structure 14 is diamond-shaped.

Then, the third mask 90 is used as a mask, the second transfer pattern layer 80 is etched, so as to form a pattern on the second transfer pattern layer 80, that is, the third mask 90 is placed right above the second transfer pattern layer 80, and the second transfer pattern layer 80 blocked by the third mask strips 91 is removed by means of exposure, so as to transfer a pattern of the third mask to the second transfer pattern layer 80.

Figure 24:
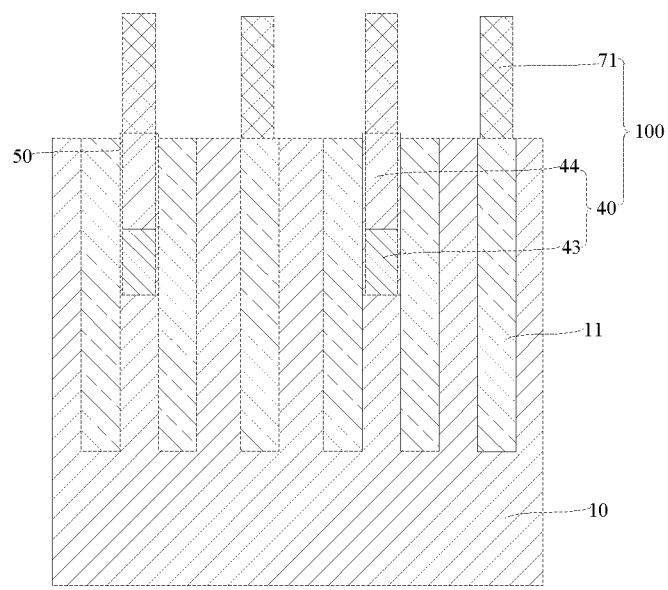
FIG. 24 is a structural schematic diagram of forming first dielectric layers in the method for manufacturing the semiconductor structure provided by embodiments of the present disclosure.

As shown in FIGS. 23 and 24, the patterned second transfer pattern layer 80 is used as a mask, the first initial dielectric layer 70 and the etching stop layer 61 are etched to form first dielectric layers 71, and each of the first dielectric layers 71 and the conductive layer 40 together constitute a bit line 100.

In the present embodiment, the conductive layer 40 is formed in the substrate 10, each of the first dielectric layers 71 are formed above the conductive layer 40, the conductive layer 40 and each of the first dielectric layers 71 together form a semi-embedded bit line structure, the semi-embedded bit line structure reduces vertical heights of the bit line 100 above the substrate 10, greatly reduces collapse risk of the bit line, and improves the stability of the semiconductor structure.

Figure 25:
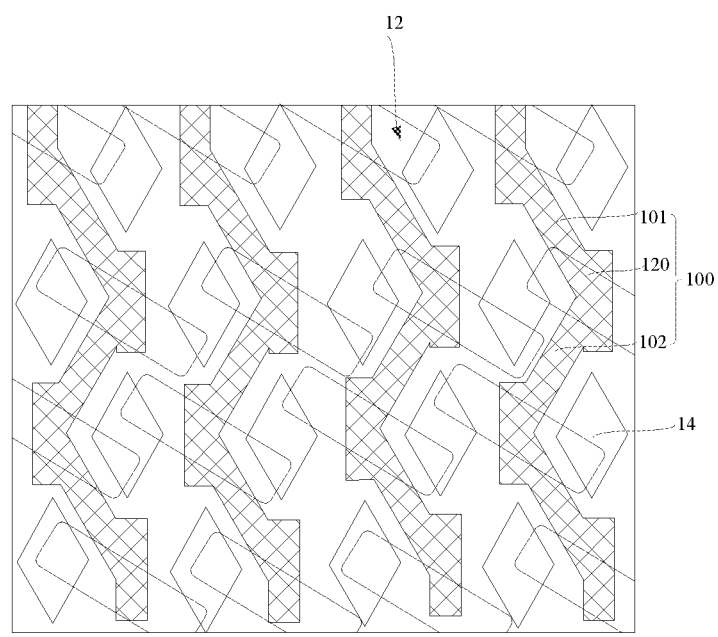
FIG. 25 is a top view of FIG. 24.

As shown in FIG. 25, the projection shape of the bit line 100 is a fold line structure; the bit line 100 includes a plurality of first bit line structures 101 extending in the second direction and a plurality of second bit line structures 102 extending in the first direction, the first bit line structures 101 and the second bit line structures 102 are arranged alternately. That is, two ends of each of the plurality of first bit line structures 101 are respectively connected to one end of each of two second bit line structures 102 adjacent to this first bit line structure, a bit line contact structure 120 is provided at a connection position of each of the plurality of first bit line structures 101 and each of the plurality of second bit line structures 102, so the semiconductor structure has a plurality of bit line contact structures 120, one of the plurality of bit line contact structures 120 is connected to one of the active regions, the bit line contact structure and the active region have a one-to-one correspondence, and the isolation structure 14 is provided in a region enclosed by adjacent each of the plurality of first bit line structures 101 and each of the plurality of second bit line structures 102.

The bit line 100 of the fold line structure designed in the present embodiment can effectively bypass the isolation structures 14, so that the plurality of first bit line structures 101 are connected to the plurality of second bit line structures 102, thereby achieving conduction of the bit line, and increasing stability of signal transmission between the bit line. In addition, compared with the related art, as the isolation structures 14 are provided between the bit line 100, the distances between bit lines 100 are increased, thereby facilitating reduction of a coupling effect between adjacent the bit lines 100 and improving electrical performance of the semiconductor structure.

Figure 26:
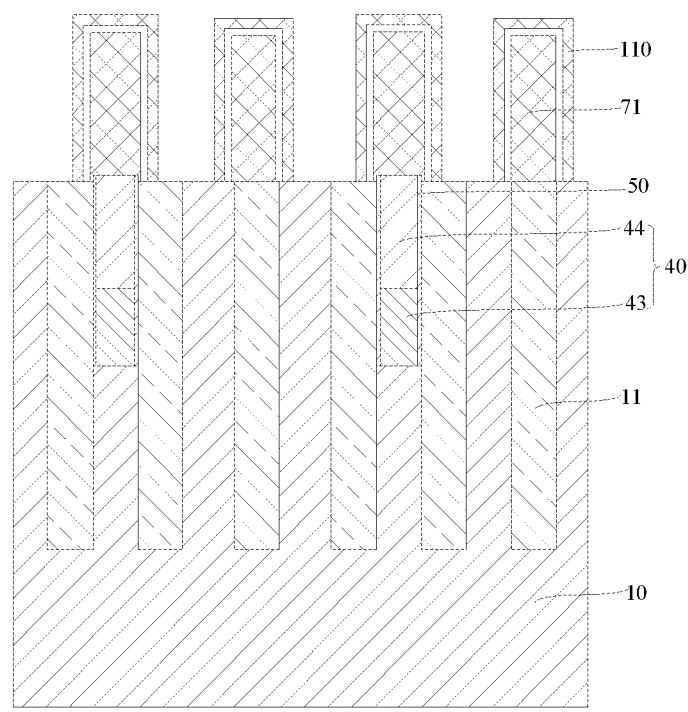
FIG. 26 is a structural schematic diagram of forming second dielectric layers in the method for manufacturing the semiconductor structure provided by embodiments of the present disclosure.

In some embodiments, after using the second transfer pattern layer as the mask, etching the first initial dielectric layer so as to form the bit line, the method for manufacturing the semiconductor structure further includes:

As shown in FIG. 26, second dielectric layers 110 are formed on the substrate 10, each of the second dielectric layers 110 covers each of the first dielectric layers 71, and an air gap is provided between each of the first dielectric layers 71 and each of the second dielectric layers 110. In the present embodiment, by arrangement of the air gap, the dielectric constant of dielectric layers composed of the first dielectric layers 71 and the second dielectric layers 110 can be reduced, so as to reduce capacitance value of a parasitic capacitor formed in the semiconductor structure, thereby improving electrical performance of the semiconductor structure.

In this embodiment, each of the first dielectric layers 71 and each of the second dielectric layers 110 both include insulation material such as silicon nitride.

Some embodiments of the present disclosure further provide a semiconductor structure. The semiconductor structure is manufactured by the method of any one of the embodiments above, and the semiconductor structure includes a substrate 10 and bit lines 100.

The substrate 10 is provided with a plurality of active regions; each of the bit lines 100 includes a conductive layer 40 and a first dielectric layer 71, the conductive layer 40 is provided in the substrate 10, top surfaces of the conductive layer 40 can be flush with the substrate 10, and the first dielectric layer 71 is located on the conductive layer 40.

The conductive layer 40 is formed in the substrate 10, each of the first dielectric layers 71 are formed above the conductive layer 40, the conductive layer 40 and each of the first dielectric layers 71 together form a semi-embedded bit line structure, the semi-embedded bit line structure reduces vertical heights of the bit lines 100 above the substrate 10, greatly reduces collapse risk of the bit lines, and improve stability of the semiconductor structure.

Further, projection shapes of the bit lines 100 are fold line structures; for example, each of the bit lines 100 includes a plurality of first bit line structures 101 extending in a second direction and a plurality of second bit line structures 102 extending in a first direction, each of the plurality of first bit line structures 101 and each of the plurality of second bit line structures 102 are arranged alternately. That is, two ends of each of the first bit line structure 101 are respectively connected to one end of each of two second bit line structures 102 adjacent to this first bit line structure, a bit line contact structure 120 is provided at a connection position of each of the plurality of first bit line structures 101 and each of the plurality of second bit line structures 102, so the semiconductor structure has a plurality of bit line contact structures 120, one of the plurality of bit line contact structures 120 is connected to one of the active regions, the bit line contact structure and the active region have a one-to-one correspondence, and the isolation structure 14 is provided in a region enclosed by adjacent each of the plurality of first bit line structures 101 and each of the plurality of second bit line structures 102.

The bit lines 100 of fold line structures can effectively bypass the isolation structures 14, so that the first bit line structures 101 are connected to the second bit line structures 102, thereby achieving conduction of the bit lines, and increasing stability of signal transmission between the bit lines. In addition, compared with the related art, as the isolation structures 14 are provided between the bit lines 100, the distances between the bit lines 100 are increased, thereby facilitating reduction of a coupling effect between adjacent the bit lines 100 and improving electrical performance of the semiconductor structure.

In some embodiments, the semiconductor structure further includes second dielectric layers 110, each of the second dielectric layers 110 is provided on the substrate 10 and each of the second dielectric layers covers each of the first dielectric layers 71, and an air gap is provided between each of the first dielectric layers 71 and each of the second dielectric layers 110. In the present embodiment, by arrangement of the air gaps, dielectric constant of dielectric layers composed of the first dielectric layers 71 and the second dielectric layers 110 can be reduced, so as to reduce capacitance value of a parasitic capacitor formed in the semiconductor structure, thereby improving performance of the semiconductor structure.

Further, the semiconductor structure further includes barrier layers 50, the barrier layers 50 are provided between the conductive layer 40 and sidewalls of each of the bit line grooves 13, and the barrier layers are configured to prevent the conductive material in the conductive layer 40 from diffusing into the substrate, thereby improving the performance of the semiconductor structure.

The examples or embodiments in this description are described in a progressive manner. Each embodiment focuses on differences from other embodiments. For the same or similar parts among the embodiments, reference may be made to each other.

In the illustration of the description, the illustrations of reference terms "an embodiment", "some embodiments", "exemplary embodiment", "an example", "a specific example", or "some examples" mean that specific features, structures, materials, or characteristics described in conjunction with the embodiments or examples are included in at least one embodiment or example of the present disclosure.

In the description, the illustrative expressions of the described terms do not necessarily refer to the same embodiment or example. Furthermore, the specific features, structures, materials, or characteristics described may be combined in any suitable manner in one or more embodiments or examples.

Finally, it should be noted that the embodiments above are only used to explain the technical solutions of some embodiments of the present disclosure, rather than limit same. Although some embodiments of the present disclosure have been explained in detail with reference to the embodiments above, a person of ordinary skill in the art would have understood that they still could modify the technical solutions disclosed in the described embodiments or make equivalent replacements to some or all of the technical features therein. However, these modifications or replacements shall not render that the nature of the corresponding technical solutions departs from the scope of the technical solutions in the embodiments of the present disclosure.

What is claimed is:

1. A method for manufacturing a semiconductor structure, comprising:

providing a substrate, the substrate comprising a plurality of active regions;

providing a first mask, the first mask comprising a plurality of first mask strips extending in a first direction, the plurality of first mask strips being parallel to one another;

using the first mask as a mask, etching the substrate blocked by the first mask strips, so as to form a plurality of first grooves in the substrate;

providing a second mask, the second mask comprising a plurality of second mask strips extending in a second direction, the plurality of second mask strips being parallel to one another, and the first direction intersecting with the second direction;

using the second mask as a mask, etching the substrate blocked by the second mask strips, so as to form a plurality of second grooves in the substrate, wherein regions, of the substrate, where the first grooves and the second grooves are located form bit line grooves, and the bit line grooves expose a part of the active regions; and forming a conductive layer in each of the bit line grooves;

wherein after forming the conductive layer in each of the bit line grooves, the method further comprises:

forming a first initial dielectric layer on the substrate;

forming a second transfer pattern layer having a pattern on the first initial dielectric layer; and using the second transfer pattern layer as a mask, etching the first initial dielectric layer, the first initial dielectric layer reserved forming first dielectric layers, each of the first dielectric layers and the conductive layer constituting a bit line; wherein forming the second transfer pattern layer having the pattern on the first dielectric layer comprises:

providing a third mask, the third mask comprising a plurality of third mask strips arranged at intervals; and using the third mask as a mask, etching the second transfer pattern layer, so as to pattern the second transfer pattern layer;

using the second transfer pattern layer as the mask, etching the first initial dielectric layer so as to form the bit line comprises:

the projection shape of the bit line is a fold line structure, and the bit line includes a plurality of first bit line structures extending in the second direction and a plurality of second bit line structures extending in the first direction, wherein each of the plurality of first bit line structures and each of the plurality of second bit line structures are arranged alternately, a bit line contact structure is provided at a connection position of each of the plurality of first bit line structures and each of the plurality of second bit line structures, the bit line contact structure is connected to the active regions, and an isolation structure is provided in a region enclosed by adjacent each of the plurality of first bit line structures and each of the plurality of second bit line structures.

2. The method for manufacturing the semiconductor structure according to claim 1, wherein
an angle between the first direction and the second direction is 10° to 60°.

3. The method for manufacturing the semiconductor structure according to claim 2, wherein
a region of the substrate except the first grooves and the second grooves constitutes a plurality of isolation structures, the second groove is located between two adjacent isolation structures in the first direction, and the first groove is located between the two adjacent isolation structures in the second direction.

4. The method for manufacturing the semiconductor structure according to claim 3, wherein
a plane parallel to the substrate is a cross section, a cross section of each of the isolation structures is diamond-shaped.

5. The method for manufacturing the semiconductor structure according to claim 2,
wherein providing the substrate comprises:
forming a first transfer pattern layer on the substrate;
using the first mask as the mask comprises:
using the first mask as the mask, etching the first transfer pattern layer blocked by the first mask strips, so as to form a plurality of first intermediate grooves in the first transfer pattern layer, a projection of each of the first intermediate grooves on the substrate coinciding with each of the first grooves; and
using the second mask as the mask comprises:
using the second mask as the mask, etching the first transfer pattern layer blocked by the second mask strips, so as to form a plurality of second intermediate grooves in the first transfer pattern layer, a projection of each of the second intermediate grooves on the substrate coinciding with each of the second grooves.

6. The method for manufacturing the semiconductor structure according to claim 1,
wherein providing the substrate comprises:
forming a first transfer pattern layer on the substrate;
using the first mask as the mask comprises:
using the first mask as the mask, etching the first transfer pattern layer blocked by the first mask strips, so as to form a plurality of first intermediate grooves in the first transfer pattern layer, a projection of each of the first intermediate grooves on the substrate coinciding with each of the first grooves; and
using the second mask as the mask comprises:
using the second mask as the mask, etching the first transfer pattern layer blocked by the second mask strips, so as to form a plurality of second intermediate grooves in the first transfer pattern layer, a projection of each of the second intermediate grooves on the substrate coinciding with each of the second grooves.

7. The method for manufacturing the semiconductor structure according to claim 6, wherein
the first transfer pattern layer comprises a plurality of sub-mask layers provided in a stacked manner, and adjacent sub-mask layers are made of different materials.

8. The method for manufacturing the semiconductor structure according to claim 1, wherein
after using the second mask as the mask, etching the substrate blocked by the second mask strips, and before forming the conductive layer in each of the bit line grooves, the method further comprises:
forming barrier layers on sidewalls of each of the bit line grooves, the barrier layers being configured to prevent conductive material in the conductive layer from diffusing into the substrate.

9. The method for manufacturing the semiconductor structure according to claim 1, wherein
the conductive layer comprises a first conductive layer and a second conductive layer which are stacked, and the first conductive layer is provided below the second conductive layer.

10. The method for manufacturing the semiconductor structure according to claim 8, wherein
the first conductive layer comprises polysilicon, and the second conductive layer comprises tungsten.

11. The method for manufacturing the semiconductor structure according to claim 9, wherein
forming the conductive layer in each of the bit line grooves comprises:
forming a first initial conductive layer in each of the bit line grooves, the first initial conductive layer extending to outside of each of the bit line grooves and being formed above the substrate;
etching the first initial conductive layer located on the substrate, and reserving a part of the first initial conductive layer in each of the bit line grooves to form the first conductive layer;
forming a second initial conductive layer on the first conductive layer, the second initial conductive layer extending to outside of each of the bit line grooves and being formed above the substrate; and
etching the second initial conductive layer, and reserving the second initial conductive layer located in each of the bit line grooves, so as to form the second conductive layer.

12. The method for manufacturing the semiconductor structure according to claim 1, wherein
after using the second transfer pattern layer as the mask, etching the first initial dielectric layer so as to form the bit line, the method further comprises:
forming second dielectric layers on the substrate, each of the second dielectric layers covering each of the first dielectric layers, and an air gap being provided between each of the first dielectric layers and each of the second dielectric layers.

13. The method for manufacturing the semiconductor structure according to claim 12, wherein
each of the first dielectric layers and each of the second dielectric layers both comprise silicon nitride.

14. A semiconductor structure, the semiconductor structure being manufactured by the method according to claim 1, wherein
the semiconductor structure comprises a substrate and bit lines, wherein the substrate is internally provided with a plurality of active regions, each of the bit lines comprises a conductive layer and a first dielectric layer, the conductive layer is provided in the substrate, and the first dielectric layer is located on the conductive layer;
wherein the projection shape of each of the bit lines is a fold line structure, and each of the bit lines included a plurality of first bit line structures extending in a second direction and a plurality of second bit line structures extending in a first direction, wherein each of the plurality of first bit line structures and each of the plurality of second bit line structures are arranged alternately, a bit line contact structure is provided at a connection position of each of the plurality of first bit line structures and each of the plurality of second bit line structures, the bit line contact structure is connected to the active regions, and an isolation structure is provided in a region enclosed by adjacent each of the plurality of first bit line structures and each of the plurality of second bit line structures.

15. The semiconductor structure according to claim 14, wherein the semiconductor structure further comprises second dielectric layers, each of the second dielectric layers is provided on the substrate and each of the second dielectric layers covers each of the first dielectric layers; and an air gap is formed between each of the first dielectric layers and each of the second dielectric layers.

16. The semiconductor structure according to claim 15, wherein the semiconductor structure further comprises barrier layers, the barrier layers are provided between the conductive layer and sidewalls of each of bit line grooves.

* * * * *